United States Patent
Tu et al.

(10) Patent No.: US 12,429,645 B2
(45) Date of Patent: Sep. 30, 2025

(54) OPTICAL FILM

(71) Applicant: BenQ Materials Corporation, Taoyuan (TW)

(72) Inventors: Yu-Wei Tu, Taoyuan (TW); Chih-Wei Lin, Taoyuan (TW); Kuo-Hsuan Yu, Taoyuan (TW)

(73) Assignee: BenQ Materials Corporation, Taoyuan (TW)

( * ) Notice: Subject to any disclaimer, the term of this patent is extended or adjusted under 35 U.S.C. 154(b) by 367 days.

(21) Appl. No.: 18/298,363

(22) Filed: Apr. 10, 2023

(65) Prior Publication Data

US 2024/0027669 A1   Jan. 25, 2024

(30) Foreign Application Priority Data

Jul. 21, 2022 (TW) .................................. 111127161

(51) Int. Cl.
- *G02B 5/30* (2006.01)
- *G02B 5/02* (2006.01)
- *G02F 1/1335* (2006.01)
- *H10K 59/80* (2023.01)

(52) U.S. Cl.
CPC ......... *G02B 5/3083* (2013.01); *G02B 5/0273* (2013.01); *G02F 1/133528* (2013.01); *H10K 59/8793* (2023.02)

(58) Field of Classification Search
CPC ................ G02B 5/3083; G02B 5/0273; H10K 59/8793; G02F 1/133528
See application file for complete search history.

(56) References Cited

U.S. PATENT DOCUMENTS

| | | | | |
|---|---|---|---|---|
| 2006/0228559 A1* | 10/2006 | Denker | ................ | G02B 5/3083 |
| | | | | 428/480 |
| 2007/0153162 A1* | 7/2007 | Wright | ................ | G02B 5/3025 |
| | | | | 349/96 |

FOREIGN PATENT DOCUMENTS

| | | |
|---|---|---|
| JP | 2020111715 A | 7/2020 |
| TW | 202132489 A | 9/2021 |

* cited by examiner

*Primary Examiner* — Nathanael R Briggs

(57) ABSTRACT

An optical film applied for a viewing side of a display is disclosed. The optical film comprises a birefringent substrate with a birefringence difference not greater than 0.10 having a slow axis and a fast axis perpendicular to each other and an diffusing layer disposed on the birefringent substrate, wherein the total haze of the optical film ranges between 30% and 80% and the reflectivity of the optical film satisfies the relationship $(R_{SCI}-R_{SCE}) \leq 1.0\%$, and $R_{SCE}/(R_{SCI}-R_{SCE}) \geq 1.6$, wherein $R_{SCI}$ is an average reflectivity of diffuse component and specular component of the optical film, and $R_{SCE}$ is an average reflectivity of diffuse component of the optical film.

18 Claims, No Drawings

OPTICAL FILM

CROSS-REFERENCE TO RELATED APPLICATION

This application claims the priority benefit of Taiwanese Application Serial Number 111127161, filed on Jul. 21, 2022, which is incorporated herein by reference.

FIELD OF THE INVENTION

The present invention relates to an optical film for display, and especially an optical film for eliminating the rainbow mura resulting from the interference of the reflective light.

BACKGROUND OF THE INVENTION

Recently, polyesters with crystallinity are used to replace the tri-cellulose acetate (TAC) which has no in-plane retardation (R0≈0 nm) as the optical film on display devices, such as, liquid crystal display (LCD), OLED display and micro LED display to provide a good moisture-permeable resistance and mechanical strength. However, the polyesters, such as polyethylene terephthalate (PET), with high crystallinity because of benzene rings so as to have birefringence, are prepared by single-axial or bi-axial stretching process to have high birefringence and high in-plane retardation (R0≥3000 nm).

The polyester optical film with a high birefringence and a high in-plane retardation is different from the TAC optical film which has no in-plane retardation. When the polyesters with a high in-plane retardation is used as the optical film at the viewing side of a display, because of the reflectivity thereof is more than the light reflected from the high-intense ambient light to convert into interference pattern with various visible wavelengths, also named as rainbow mura, to reduce the display quality.

It has been proposed solutions for the rainbow interference pattern in optical film, as described in Taiwanese Patent TWI406001, the patent discloses an optical layered body comprising a polyester base having a retardation (in-plane retardation, R0) of not less than 8000 nm to reduce the problem of the rainbow interference pattern and the interference fringes by coordinating the refractive index of the primer on the base, a hard coating and the polyester base. Taiwanese Patent TWI531472 describes a polarizer with a protection film having an in-plane retardation (R0) of greater than 10,000 nm and a thickness direction retardation (Rth) of nm to 12,000 nm to solve the problems of rainbow stain on the optical film.

SUMMARY OF THE INVENTION

The present invention is to provide an optical film for the viewing side of a display, which comprises a birefringent substrate for providing a good moisture-permeable resistance and mechanical strength and a light diffusing layer disposed on the substrate for reducing the intensity of the light reflected from the surface of the film and reducing the coherence and directionality of the reflected light so as to effectively reduce the occurrence of the rainbow mura.

An aspect of the present invention is to provide an optical film for the viewing side of a display, which comprise a birefringent substrate and a light diffusing layer, wherein the birefringent substrate has a birefringence ($\Delta n$) of not more than 0.10 and has a slow axis and a fast axis perpendicular to each other, the light diffusing layer is disposed on one side of the birefringent substrate, wherein the total haze of the optical film ranges between 30% and 80%, and the reflectivity thereof satisfies the relationship: $(R_{SCI}-R_{SCE}) \leq 1.0\%$, and $R_{SCE}/(R_{SCI}-R_{SCE}) \geq 1.6$, wherein $R_{SCI}$ is an average reflectivity of diffuse component and specular component (specular component included, SCI) of the optical film, and $R_{SCE}$ is an average reflectivity of diffuse component (specular component excluded, SCE) of the optical film.

In the optical film of one embodiment of the present invention, the birefringence ($\Delta n$) of the birefringent substrate is in the range of 0.02 to 0.09 and preferably in the range of 0.02 to 0.08.

In the optical film of one embodiment of the present invention, the total haze of the optical film is the sum of the surface haze and the internal haze, wherein the surface haze of the optical film is more than 25%.

In the optical film of one embodiment of the present invention, the $(R_{SCI}-R_{SCE})$ of the optical film is preferably in the range of 0.1% to 0.9%, and the $R_{SCE}$ is less than 4.0%.

In the optical film of one embodiment of the present invention, the thickness of the light diffusion layer is in the range of 2 µm to 10 µm.

In the optical film of one embodiment of the present invention, the light diffusing layer can further comprise a refractive-index-matching layer, wherein the refractive index of the light diffusion layer is n1 and the refractive index of the refractive-index-matching layer is n2, and n2<n1.

In the optical film of one embodiment of the present invention, the refractive index n1 of the light diffusion layer is in the range of 1.50 to 1.70, and the refractive index n2 of the refractive-index-matching layer is in the range of 1.20 to 1.50.

In the optical film of one embodiment of the present invention, the thickness of the refractive-index-matching layer is in the range of 0.1 µm to 0.3 µm.

In the optical film of one embodiment of the present invention, the average reflectivity $R_{SCE}$ of diffuse component of the optical film comprising the refractive-index-matching layer is less than 2.0%.

In the optical film of one embodiment of the present invention, the birefringent substrate is a uniaxial or biaxial stretched polyester film.

In the optical film of one embodiment of the present invention, the thickness of the birefringent substrate is preferably in the range of 40 µm to 150 µm.

The present optical film can be used on the viewing side of micro LED display, liquid crystal display (LCD), OLED display and the likes.

The another aspect of the present invention is to provide a polarizer comprising a polarizing layer with an absorption axis; and an optical film comprising a birefringent substrate having a birefringence ($\Delta n$) of not more than 0.10 and having a slow axis and a fast axis perpendicular to each other, wherein the birefringent substrate is adjacent to the polarizing layer and the slow axis thereof is parallel to the absorption axis of the polarizing layer; and a light diffusing layer disposed on the other side of the birefringent substrate opposite to the polarizing layer; wherein the total haze of the optical film is between 30% and 80%, and the reflectivity thereof satisfies the relationship: $(R_{SCI}-R_{SCE}) \leq 1.0\%$, and $R_{SCE}/(R_{SCI}-R_{SCE}) \geq 1.6$, wherein $R_{SCI}$ is an average reflectivity of diffuse component and specular component (specular component included, SCI) of the optical film, and $R_{SCE}$ is an average reflectivity of diffuse component (specular component excluded, SCE) of the optical film.

In the polarizer of one embodiment of the present invention, the included angle between the absorption axis of the polarizing layer and the horizontal viewing angle direction of the display is from 0° to 45°.

The above and other aspects of the invention will become better understood with regard to the following detailed description of the preferred but non-limiting embodiment(s). These and other aspects of the invention will become apparent from the following description of the presently preferred embodiments. The detailed description is merely illustrative of the invention and does not limit the scope of the invention, which is defined by the appended claims and equivalents thereof. As would be obvious to one skilled in the art, many variations and modifications of the invention may be affected without departing from the spirit and scope of the novel concepts of the disclosure.

DETAILED DESCRIPTION OF THE INVENTION

In the following detailed description, for purposes of explanation, numerous specific details are set forth in order to provide a thorough understanding of the disclosed embodiments. It will be apparent, however, that one or more embodiments may be practiced without these specific details.

It is apparent that departures from specific designs and methods described and shown will suggest themselves to those skilled in the art and may be used without departing from the spirit and scope of the invention. The present invention is not restricted to the particular constructions described and illustrated, but should be construed to cohere with all modifications that may fall within the scope of the appended claims.

Unless defined otherwise, all technical and scientific terms used herein have the same meaning as commonly understood by one of ordinary skill in the art to which this invention belongs. Generally, the nomenclature used herein and the laboratory procedures are well known and commonly employed in the art. Conventional methods are used for these procedures, such as those provided in the art and various general references. Where a term is provided in the singular, the inventors also contemplate the plural of that term. The nomenclature used herein and the laboratory procedures described below are those well-known and commonly employed in the art.

The term "(meth)acrylate" used herein refers to acrylate or methacrylate.

An aspect of the present invention is to provide an optical film for the viewing side of a display, which comprise a birefringent substrate and a light diffusing layer, wherein the birefringent substrate has a birefringence ($\Delta n$) of not more than 0.10 and has a slow axis and a fast axis perpendicular to each other, the light diffusing layer disposed on one side of the birefringent substrate, wherein the total haze of the optical film is between 30% and 80%, and the reflectivity thereof satisfies the relationship: $(R_{SCI}-R_{SCE}) \leq 1.0\%$, and $R_{SCE}/(R_{SCI}-R_{SCE}) \geq 1.6$, wherein $R_{SCI}$ is an average reflectivity of diffuse component and specular component (specular component included, SCI) of the optical film, and R SCE is an average reflectivity of diffuse component (specular component excluded, SCE) of the optical film.

It is known to use polyester film as an optical film on the viewing side of a display for providing moisture-permeable resistance and mechanical strength. Since the reflectivity of the polyester film is more than 5.0% without any surface treatment, the polyester film is required to have an in-plane retardation R0 of more than 8000 nm, high light-diffusion surface or a high thickness to reduce the rainbow mura or rainbow interference pattern.

The polyester used as birefringent substrate in the present optical film is not required to have a high in-plane retardation R0. Therefore, the in-plane retardation R0 of the birefringent substrate disclosed in the present invention has a wider tolerance. It is preferred to use a polyester film with a polyester film with an in-plane retardation R0 in the range of 1000 nm and 6000 nm, and the rainbow mura defect is not prone to appear. However, not only the birefringent substrate with above mentioned in-plane retardation can be used, but also a polyester film which provides the desired mechanical strength and moisture-permeable resistance and is fabricated with desired crystallinity materials under a proper stretch ratio to provide a birefringence ($\Delta n$) of no more than 0.10 can be used. The birefringence of the birefringent substrate is preferably in the range of 0.02 to 0.09 and more preferably in the range of 0.02 to 0.08.

The reflectivity is measured by adhering the optical film via an optical adhesive to a black acrylic plate and measuring the average diffuse and specular reflectivity of SCI (Specular Component Included) mode and the average reflectivity of diffuse reflectivity of SCE (Specular Component Excluded) mode of the surface of the optical film by HITACHI U-4150 spectrometer in a wavelength range of 380-780 nm. Due to the poor coherence of the diffusing light, the specular reflective light is the main interference component, and the average reflectivity of the specular reflective light of the optical film can be obtained by $(R_{SCI}-R_{SCE})$. When restricting $(R_{SCI}-R_{SCE})$ of the optical film of the present invention less than or equal to 1.0% and the reflectivity ratio $R_{SCE}/(R_{SCI}-R_{SCE})$ of the diffusing light and specular reflective light of the optical film greater than or equal to 1.6, the occurrence of rainbow mura and interference fringes can be reduced, or even rainbow mura and interference fringes occurs, they are not visible by human eyes due to the insufficient light intensity and contrast.

In the optical film of one embodiment of the present invention, the $(R_{SCI}-R_{SCE})$ of the optical film is between 0.1% and 0.9% and the $R_{SCE}$ of the optical film is less than 4.0% and preferably in the range of 1.0% to 4.0%.

In the optical film of one embodiment of the present invention, the total haze of the optical film is more than 30% in order to convert the direction and coherence of the ambient light in the light diffusion layer. In a preferred embodiment of the present invention, the surface haze of the optical film is more than 25%. Since the surface haze is contributed from the roughness, surface structure and surface morphology of the light diffusing layer, the ambient light will contact the surface of the light diffusing layer to enter into the layer and reflect from the surface, the light diffusing layer can provide a longer go-back-and-forth light path for the ambient light. In a preferred embodiment, the thickness of the light diffusing layer is in the range of 2 μm to 10 μm and preferably in the range of 3 μm to 8 μm in order to avoid the display image blurred.

The optical film of one embodiment of the present invention can further comprises a refractive-index-matching layer on the light diffusing layer, wherein the refractive index of the light diffusing layer is n1 and the refractive index of the refractive-index-matching layer is n2 and n2<n1.

The present optical film with a light diffusing layer and a refractive-index-matching layer can reduce a coherence of reflective light and further reduce the intensity of reflective light. As the high crystallinity of the polyester substrate used in the optical film of the present invention and even the birefringence thereof lowered to less than or equal to 0.10, the average refractive index thereof is more than about 1.6. When the light diffusing layer and the refractive-index-matching layer, the refractive indices thereof are between 1.0 and 1.6, are disposed between the birefringent substrate and air (refractive index about 1.0), for example, the light diffusing layer with refractive index n1 of about 1.5 and the refractive-index-matching layer with refractive index n2 of about 1.4 and the refractive index n2 is less than the refractive index n1, the total reflectivity of the ambient light is reduced but does not affect the coherence interrupting of ambient light caused by go-back-and-forth of the light in the light diffusing layer. A preferable embodiment of the optical film of the present invention, the refractive index n1 of the light diffusing layer is in the range of 1.50 to 1.70, and the refractive index n2 of the refractive-index-matching layer is in the range of 1.20 to 1.50.

A preferable embodiment of the optical film of the present invention, the refractive-index-matching layer on the light diffusing layer reduces the occurrence of the rainbow interference pattern and simultaneously reduces the diffusing light generated in the light diffusing layer so as to lower the surface haze of the light diffusing layer. In the optical film with a refractive-index-matching layer, the average reflectivity $R_{SCE}$ of diffuse component (specular component excluded, SCE) of the optical film is less than 2.0%, and preferably is in the range of 0.8% to 2.0%.

In a preferred embodiment of the optical film of the present invention, the thickness of the refractive-index-matching layer being less than the thickness of the light diffusing layer, such as, in the range of 0.1 μm to 0.3 is sufficiently to reduce the reflection of the ambient visible light but will not flatten the surface of the light diffusing layer to result in the change of the surface morphology and the roughness. Therefore, the scattering of the visible light pass through the light diffusing layer will not be affected.

The present optical film can be used on the viewing side of micro-LED display, liquid crystal display (LCD), OLED display and the likes. All display devices, either active matrix display devices or passive matrix display devices, will confront the situation that the ambient light is reflected at the interfaces on the both sides of the substrate of the optical film, and the interference of the ambient light can be reduced directly by the light diffusing layer of the present optical film. When the present optical film is used with linear polarizer or circular polarizer, the optical axis of the birefringent substrate of the optical film has to match with the absorption axis of the polarizer in order to further reduce the reflection of the ambient light.

The another aspect of the present invention is to provide a polarizer comprising a polarizing layer with an absorption axis; and an optical film comprising a birefringent substrate having a birefringence (Δn) of not more than 0.10 and having a slow axis and a fast axis perpendicular to the slow axis, wherein the birefringent substrate is adjacent to the polarizing layer and the slow axis is parallel to the absorption axis of the polarizing layer; and a light diffusing layer disposing on the other side of the birefringent substrate opposite to the polarizing layer; wherein the total haze of the optical film is between 30% and 80%, and the reflectivity thereof satisfies the relationship: $(R_{SCI}-R_{SCE}) \leq 1.0\%$, and $R_{SCE}/(R_{SCI}-R_{SCE}) \geq 1.6$, wherein $R_{SCI}$ is an average reflectivity of diffuse component and specular component (specular component included, SCI) of the optical film, and R SCE is an average reflectivity of diffuse component (specular component excluded, SCE) of the optical film.

In the polarizer of one embodiment of the present invention, the included angle between the absorption axis of the polarizing layer and the horizontal viewing angle direction of the display ranges from 0° to 45°.

In an embodiment of the present polarizer, the birefringent substrate of the optical film can be a polyester films stretched single-axially or bi-axially and having at least light transmittance of 90%, such as, for example, polyethylene terephthalate (PET), polybutylene terephthalate (PBT) or polyethylene naphthalate (PEN). In an embodiment of the polarizer of the present invention, the optical film can use a birefringent substrate with UV absorbent.

In another embodiment of the present optical film, the suitable thickness of the birefringent substrate used in the optical film is ranging from 10 μm to 150 μm and preferably from 15 μm to 120 μm.

In an embodiment of the present optical film, the light diffusion layer comprises an acrylate binder resin and a plurality of amorphous silica microparticles and optionally, organic microparticles.

In an embodiment of the present optical film, the amorphous silica microparticles suitable used in the light diffusion layer have a laser diffraction average particle size of ranging between 3 μm and 10 μm, and preferably between 3.0 μm and 8.0 μm, and the BET specific surface area of ranging between 60 and 100 m$^2$/g and preferably between 65 m$^2$/g and 90 m$^2$/g. The use amount of the amorphous silica microparticles in the light diffusion layer is ranging between 6 and 25 parts by weight per hundred parts by weight of the acrylate binder resin and preferably between 7 and parts by weight.

In the present optical film, the light diffusion layer can optionally add organic microparticles. The organic microparticles in the light diffusion layer are monodispersity, and the average particle size thereof is less than the average particle size of the amorphous silica microparticles. The laser diffraction average particle size of the suitable organic microparticles in the present invention is ranging between 2.0 μm and 8.0 μm. In the light diffusion layer, the use amount of the organic microparticles is ranging between 6 and 40 parts by weight per hundred parts by weight of the acrylate binder resin and preferably between 10 parts by weight and 38 parts by weight.

The suitable organic microparticles used in the light diffusion layer can be polymethyl methacrylate resin microparticles, polystyrene resin microparticles, styrene-methyl methacrylate copolymer microparticles, melamine microparticles, polyethylene resin microparticles, epoxy resin microparticles, polysiloxane resin microparticles, polyvinylidene fluoride resin microparticles or polyvinyl fluoride resin microparticles. The refractivity of the suitable organic microparticles is ranging between 1.40 and 1.70.

In the acrylate binder resin of the light diffusion layer of the present optical film, the total amount of the amorphous silica microparticles and organic microparticles in the acrylate binder resin is between 15 parts by weight and 50 parts by weight per hundreds parts by weight of the acrylic binder resin. The ratio of the use amount in parts by weight of the organic microparticles and the amorphous silica microparticles is no less than 0.3 and no more than 5.

The acrylate binder resin of the light diffusion layer of the present optical film comprises a (meth)acrylate composition and a initiator, wherein the (meth)acrylate composition comprises 35 to 50 parts by weight of the polyurethane (meth)acrylate oligomer with a functionality of 6 to 15, 12 to 20 parts by weight of the (meth)acrylate monomer with a functionality of 3 to 6 and 1.5 to 12 parts by weight of the (meth)acrylate monomer with a functionality of less than 3, wherein the polyurethane (meth)acrylate oligomer with a functionality of 6 to 15 is preferably the aliphatic polyurethane (meth)acrylate oligomer with the molecular weight ranging between 1,000 and 4,500.

In the acrylate binder resin, the suitable (meth)acrylate monomer with a functionality of 3 to 6 preferably can be the (meth)acrylate monomer with the molecular weight less than 800, such as, but not limited to pentaerythritol triacrylate (PETA), dipentaerythritol hexaacrylate (DPHA), dipentaerythritol pentaacrylate (DPPA) or combination thereof. The suitable (meth)acrylate monomer with a functionality of less than 3 can be a (meth)acrylate monomer with a functionality of 1 or 2 and the molecular weight thereof is less than 500, such as, but not limited to 1,6-hexanediol diacrylate (HDDA), cyclic trimethylolpropane formal acrylate (CTFA), 2-phenoxyethyl acrylate (PHEA) or isobornyl acrylate (IBOA) or combinations thereof.

The suitable initiator used in the acrylate binder resin of the light diffusion layer of the present optical film can be selected from those commonly used in the related art, such as, but not limited to, acetophenones-based initiator, diphenylketones-based initiator, propiophenones-based initiator, benzophenones-based initiator, bifunctional α-hydroxyketones-based initiator, acylphosphine oxides-based initiator and the like. The above-mentioned initiators can be used alone or in combination.

In the light diffusing layer of the present optical film can further comprise a leveling agent to provide a good leveling and smoothness of the coated surface. The light diffusing layer of the present optical film can optionally further comprise a re-coating leveling agent in order to enable the light diffusing layer to recoat the other optical functional film. The fluorine-based, (meth)acrylate-based or organosilicon-based leveling agents can be used in the light diffusion layer of the present invention.

In another embodiment of the present optical film, a refractive-index-matching layer can be disposed on the light diffusing layer. The refractive-index-matching layer comprises a binder resin, a plurality of hollow silica nanoparticles, and a leveling agent comprising a perfluoropolyether group-containing (meth)acrylic-modified organosilicone, wherein the average particle size of the hollow silica nanoparticles is ranging between 50 nm and 100 nm.

The binder resin used in the refractive-index-matching layer of the present optical film can be (meth)acrylate resin or the fluoro-and-acrylic-modified polysiloxane resin. In a preferred embodiment of the refractive-index-matching layer of the optical film, the (meth)acrylate resin in the refractive-index-matching layer can be pentaerythritol tri (meth)acrylate, dipentaerythritol hexa(meth)acrylate, pentaerythritol tetra(meth)acrylate, dipentaerythritol penta(meth)acrylate, trimethylolpropane tri(meth)acrylate, ditrimethylolpropane tetra(meth)acrylate, dipentaerythritol tetra(meth)acrylate or the combination thereof. When the (meth) acrylate resin is used as the binder resin for the refractive-index-matching layer, the use amount of the hollow silica nanoparticles in the refractive-index-matching layer is ranging between 60 and 130 parts by weight per hundred parts by weight of the (meth) acrylate resin.

In another embodiment of the optical film of the present invention, the fluoro-and-acrylic-modified polysiloxane resin used in the refractive-index-matching layer can be a polysiloxane having a siloxane main chain, a branched chain containing a fluoroalkyl group and a branched chain containing an acrylate functional group. The suitable fluoro-and-acrylic-modified polysiloxane resin can be, but not limited to, for example, commercially available siloxane resin products, such as X-12-2430C manufactured by Shin-Etsu Chemical Co., Ltd., Japan. When the fluoro-and-acrylic-modified polysiloxane resin is used as the binder resin for refractive-index-matching layer of the present optical film, the use amount of the hollow silica nanoparticles in the refractive-index-matching layer is ranging between 90 and 350 parts by weight per hundred parts by weight of the fluoro-and-acrylic-modified polysiloxane resin.

In another embodiment of the refractive-index-matching layer of the present optical film, the refractive-index-matching layer can further comprise a leveling agent. The suitable leveling agent can be a perfluoropolyether group-containing (meth)acrylic-modified organosilicone compound. The suitable leveling agent comprising a perfluoropolyether group-containing (meth)acrylic-modified organosilicone compound can be, but not limited to, for example, commercially available products, such as X-71-1203E, KY-1203, KY-1211 or KY-1207 manufactured by Shin-Etsu Chemical Co., Ltd., Japan. The use amount of the leveling agent varies with the type of binder resin used. When the (meth)acrylate resin is used as the binder resin for the refractive-index-matching layer, the use amount of the leveling agent is ranging between 5 and 20 parts by weight per hundred parts by weight of the (meth)acrylate resin. When the fluoro-and-acrylic-modified polysiloxane resin is used as the binder resin for the refractive-index-matching layer, the use amount of the leveling agent in the refractive-index-matching layer is ranging between 1 and 45 parts by weight per hundred parts by weight of the fluoro-and-acrylic-modified polysiloxane resin.

The suitable initiator used in the refractive-index-matching layer of the present optical film can be, but not limited to, for example, commercially available products, such as "Esacure KIP-160", "Esacure One", "Omnirad 184", "Omnirad 907" and "Omnirad TPO" manufactured by IGM Resins B.V., Netherlands, and "TR-PPI-ONE" manufactured by Tronly Enterprise Co., Ltd., Hong Kong.

Another aspect of the present invention is to provide a method for preparing an optical film. The present method comprises steps of mixing a (meth)acrylate composition comprising a polyurethane (meth)acrylate oligomer with a functionality of 6 to 15, at least one (meth)acrylate monomer with a functionality of 3 to 6, at least one (meth)acrylate monomer with functionality of less than 3, an initiator and adequate solvent(s) and stirred evenly for preparing an acrylate binder resin solution; adding a plurality of amorphous silica microparticles, a leveling agent and an adequate organic solvent into the acrylic binder resin solution and stirring evenly for preparing a light diffusion coating solution; coating the light diffusion coating solution on a birefringent substrate, drying the light diffusion coating layer on the birefringent substrate, curing the light diffusion coating layer on the birefringent substrate by radiation or electron beam for forming a light diffusion layer to obtain an optical film.

Another embodiment of the method for preparing the present optical film comprises steps, after preparing an acrylate binder resin solution, adding a plurality of amorphous silica microparticles, a plurality of organic microparticles, a leveling agent and an adequate organic solvent into the acrylate binder resin solution and stirring evenly for preparing a light diffusing coating solution; coating the light diffusion coating solution on a birefringent substrate, drying the light diffusion coating layer on the birefringent substrate, curing the light diffusion coating layer on the birefringent substrate by radiation or electron beam for forming a light diffusion layer to obtain an optical film.

In the preparation method of the present optical film, the solvents suitable for light diffusing coating solution can be the organic solvents commonly used in the related art, such as ketones, aliphatic, cycloaliphatic or aromatic hydrocarbons, ethers, esters or alcohols. The (meth)acrylate composition, light diffusion coating solution and the refractive-index-matching coating solution can use one or one more organic solvents. The suitable solvent can be such as, but not limited to acetone, butanone, cyclohexanone, methyl isobutyl ketone, hexane, cyclohexane, dichloromethane, dichloroethane, toluene, xylene, propylene glycol methyl ether, methyl acetate, ethyl acetate, propyl acetate, butyl acetate, n-butanol, isobutanol, isopropanol, diacetone alcohol, propylene glycol methyl ether acetate, cyclohexanol or tetrahydrofuran and the likes.

In other embodiments of the present invention, other additives such as antistatic agents, colorants, flame retardants, ultraviolet absorbers, antioxidants, surface modifiers, antimicrobial agent or defoaming agent can be added to the light diffusion coating solution as required for providing desired properties.

The aforementioned coating solution can be applied to the substrate surface by any method known in the related art, for example, bar coating, doctor blade coating, dip coating, roll coating, spinning coating, spray coating, slot-die coating and the like.

The present optical film can further comprise a refractive-index-matching layer on the light diffusing layer in order to reduce the cloudiness on the surface of the light diffusing layer when eliminating the rainbow interference patterns.

The refractive-index-matching layer of the present optical film can be prepared by mixing a binder resin, a plurality of hollow silica nanoparticles, an initiator, a leveling agent and an adequate solvent and evenly stirring for preparing a solution; coating the solution on the light diffusing layer of a birefringent substrate, drying to remove the solvent and curing the coating layer on the light diffusing layer by radiation or electron beam for forming a refractive-index-matching layer to obtain an optical film.

The solvents used in the preparation method for the refractive-index-matching layer can be the one used for preparing the light diffusing coating solution. In other embodiments of the present invention, the prepared refractive-index-matching layer can add antistatic agents, colorants, flame retardants, ultraviolet absorbers, antioxidants, surface modifiers, antimicrobial agents or defoaming agents to provide desired properties. The refractive-index-matching layer can be coated by any method known in the related art, for example, bar coating, doctor blade coating, dip coating, roll coating, spinning coating, spray coating, slot-die coating and the like.

The present optical film can be used on the viewing side of micro-LED display, liquid crystal display (LCD), OLED display and the likes.

When the optical film disclosed in the present invention used in micro-LED display, the optical film can be adhered to the viewing side of the display.

When the optical film of the present invention is used to a display which a polarizer is needed, such as LCD, OLED and the like, the optical film can be adhered to a polarizer by the slow axis of the birefringent substrate of the optical film parallel to the absorption axis of the polarizing layer of the polarizer. In another embodiment of the present invention, the present optical film is adhered to a polarizer with the slow axis of the birefringent substrate parallel to the absorption axis and the obtained polarizer is adhered to a display with an included angle between the absorption axis of the polarizing layer, and the horizontal viewing angle direction of the display ranges from 0° to 45°.

The present invention will be explained in further detail with reference to the examples. However, the present invention is not limited to these examples.

EXAMPLE

Preparation Example 1: Preparation of Acrylate Binder Resin 42 parts by weight of polyurethane acrylate oligomer (functionality of 6, molecular weight of about 1,600, viscosity of 36,000 cps (at 25° C.), commercially obtained from IGM, Taiwan), 4.5 parts by weight of PETA, 12 parts by weight of DPHA, 3 parts by weight of CTFA, 4 parts by weight of initiator (Chemcure-481, available from Chembridge International Co., Ltd., Taiwan), 24.5 parts by weight of ethyl acetate (EAC) and 10 parts by weight of n-butyl acetate (nBAC) were mixed for 1 hour to obtain an acrylic binder resin.

Preparation Example 2: Preparation of Light Diffusing Coating Solution I 154.5 parts by weight of acrylate binder resin obtained from Preparation Example 1, 9.3 parts by weight of amorphous silica microparticles (Nipsil® SS-50B, average particle size 4 µm, refractive index of 1.451.47, available form Tosoh Silica Corp., Japan), 1.7 parts by weight of dispersing agent (DisperBYK-2150, solid content of 5%, solvents: ethyl acetate and propylene glycol methyl ethyl acetate, available from BYK-Chemie, Germany), 30.9 parts by weight of polyether-modified acrylate leveling agent (BYK-UV3535, solid content of 10%, solvent: ether acetate, available from BYK-Chemie, Germany), 7 parts by weight of silica nanoparticles dispersion (NanoBYK-3650, average particle size 20 nm, solid content 31%, solvent: propylene glycol monomethyl ether acetate/propylene glycol monomethyl ether, commercially obtained from BYK, Germany), 38.6 parts by weight of ethyl acetate (EAC) and 108.1 parts by weight of n-butyl acetate (nBAC) were mixed and stirred to be uniformly dispersed to obtain a light diffusing coating solution I.

Preparation Example 3: Preparation of Light Diffusing Coating Solution II 120.3 parts by weight of acrylate binder resin obtained from Preparation Example 1, 9.6 parts by weight of polystyrene microparticles (XX-40IK, average particle size 3 µm, refractive index 1.59, available from Sekisui Plastics Co., Ltd., Japan), 9.6 parts by weight of amorphous silica microparticles (Nipsil® SS-50B), 2.6 parts by weight of dispersant (DisperBYK-2150), 8.1 parts by weight of polyether-modified acrylate leveling agent (BYK-UV3535), 5.4 parts by weight of silica nanoparticles dispersion (NanoBYK-3650), 48.1 parts by weight of ethyl acetate (EAC) and 96.2 parts by weight of n-butyl acetate (nBAC) were mixed and stirred for 1 hour for uniformly dispersing to obtain a light diffusing coating solution II.

Preparation Example 4: Preparation of Light Diffusing Coating Solution III 100 parts by weight of the acrylate binder resin obtained from Preparation Example 1, 7.5 parts by weight of amorphous silica microparticles (Nipsil® SS-50B), 2.06 parts by weight of dispersant (DisperBYK-2150), 6.7 parts by weight of polyether-modified acrylate leveling agent (BYK-UV3535), 4.5 parts by weight of silica nanoparticles dispersion (NanoBYK-3650), 80 parts by weight of ethyl acetate (EAC) and 20.2 parts by weight of n-butyl acetate (nBAC) were mixed and stirred 1 hour to be uniformly dispersed to obtain a light diffusing coating solution III.

Preparation Example 5: Preparation of Refractive-Index-Matching Coating Solution I 35 parts by weight of fluorine-containing acrylate-modified polysiloxane resin (X-12-2430C, available from Shin-Etsu Chemical Co., Ltd., Japan), 2 parts by weight of photoinitiator (KIP-160, available from IGM Resin, Netherlands), 22 parts by weight of a perfluoropolyether containing (meth)acrylic-modified organosilicone (X-71-1203E, solid content of 20%, solvent: methyl ethyl ketone, available from Shin-Etsu Chemical Co., Ltd., Japan), 187 parts by weight of hollow silica nanoparticle dispersion (Thrulya 4320, solid content 20%, average primary particle size 60 nm, solvent: methyl isobutyl ketone, JGC Catalysts and Chemicals Ltd., Japan), 1377 parts by weight of ethyl acetate (EAC) and 1377 parts by weight of propylene glycol methyl ether acetate (PGMEA) were mixed and stirred for 10 minutes to obtain a refractive-index-matching coating solution I.

Preparation Example 6: Preparation of Refractive-Index-Matching Coating Solution II 18.3 parts by weight of fluorine-containing acrylate-modified polysiloxane resin (X-12-2430C), 6.1 parts by weight of the fluorinated polyurethane oligomer with the functionality of 6 (LR6000, commercially available from Miwon, Korea), 1.6 parts by weight of photoinitiator (KIP-160), 15 parts by weight of a perfluoropolyether containing (meth)acrylic-modified organosilicone (X-71-1203E), 160 parts by weight of hollow silica nanoparticles dispersion (Thrulya 4320) and 2144 parts by weight of ethyl acetate (EAC) were mixed and stirred for 10 minutes to obtain a refractive-index-matching coating solution II.

Example 1

The obtained light diffusing coating solution I from Preparation Example 2 was coated on a PET film (O321E, available from Mitsubishi Chemical Corp, Japan) with a thickness of 50 μm having a birefringence (Δn) of 0.043 and an in-plane retardation R0(550 nm) of 2136 nm. After drying, the coated film was cured by a UV lamp with a radiation dose of 298 mJ/cm2 under a nitrogen atmosphere to form a light diffusion layer with a thickness of 5.5 μm on the PET film to obtained an optical film.

The optical properties of the optical film obtained from Example 1 were determined in accordance with the measurement described hereinafter. The results were shown in Table 1.

Haze measurement: The haze was measured according to the test method of JIS K7136 by the NDH-2000 Haze Meter (manufactured by Nippon Denshoku Industries, Japan).

Internal haze and surface haze measurement: The optical film was adhered to a triacetyl cellulose (TAC) substrate with a thickness of 40 μm (T40UZ, available from Fujifilm, Japan) was adhered onto the optical film by a transparent optical adhesive to make the uneven surface of the optical film smooth. In this state, the internal haze and the total haze of the optical film were measured according to the test method of JIS K7136 by the NDH-2000 Haze Meter, and the surface haze of the optical film could be obtained by deducting the internal haze from the total haze thereof.

Light transmittance measurement: The light transmittance of the optical film was measured according to the test method of JIS K7361 by the NDH-2000 Haze Meter.

Gloss measurement: The gloss of the optical film was adhered to a black acrylic plate via a transparent optical adhesive and measured according to the test method of JIS Z8741 by the BYK Micro-Gloss gloss meter at viewing angles of 20, 60 and 85 degrees.

Clarity measurement: The optical film was cut into a sample of 5×8 cm2, and the sample was measured according to the test method of JIS K7374 by the SUGA ICM-IT image clarity meter, and the sum of the measured values at slits of 0.125 mm, 0.25 mm, 0.50 mm, 1.00 mm and 2.00 mm was the clarity.

Reflectivity measurement: The optical film was adhered to a black acrylic plate and the average reflectivity $R_{SCI}$ including diffusion and specular reflections and the average reflectivity $R_{SCE}$ including diffusion reflection of the optical film were measured by the HITACHI U-4150 spectrometer in a wavelength range of 380-780 nm.

Rainbow mura evaluation: The rainbow mura of the optical film was evaluated by adhering the optical film via a transparent optical adhesive to an 8K liquid crystal display (SHARP, AQUOS LC-70X500T) whose surface optical film was removed. The rainbow mura of the optical film for the polarizer was evaluated at viewing angles of 0 degree and 60 degrees with the luminance of gray level 255 (L255) of liquid crystal display. If there was no identifiable rainbow mura, the evaluation was "extremely excellent"; if there was slightly identifiable rainbow mura, but the quality was acceptable, the evaluation was "excellent"; if there was an obvious identifiable rainbow mura, the evaluation was "poor".

Example 2

The light diffusing coating solution II obtained from Preparation Example 3 was coated on a PET film (O321E, available from Mitsubishi Chemical Corp, Japan) with a thickness of 50 μm having a birefringence (Δn) of 0.043 and an in-plane retardation R0(550 nm) of 2136 nm. After drying, the coated film was cured by a UV lamp with a radiation dose of 298 mJ/cm$^2$ under a nitrogen atmosphere to form a light diffusion layer with a thickness of 5.5 μm on the PET film to obtained an optical film.

The optical properties of the optical film obtained from Example 2 were determined in accordance with the measurement described hereinbefore. The results were shown in Table 1.

Example 3

The light diffusing coating solution I prepared by Preparation Example 2 was coated on a PET film (O321E) with a thickness of 75 μm having a birefringence (Δn) of 0.049 and an in-plane retardation R0(550 nm) of 3654 nm. After drying, the coated film was cured by a UV lamp with a radiation dose of 298 mJ/cm$^2$ under a nitrogen atmosphere to form a light diffusion layer with a thickness of 4.0 μm on the PET film to obtain an optical film.

The optical properties of the optical film obtained from Example 3 were determined in accordance with the measurement described hereinbefore. The results were shown in Table 1.

Example 4

The light diffusing coating solution II prepared by Preparation Example 3 was coated on a PET film (O321E) with a thickness of 75 μm having a birefringence (Δn) of 0.049 and an in-plane retardation R0(550 nm) of 3654 nm. After drying, the coated film was cured by a UV lamp with a radiation dose of 298 mJ/cm$^2$ under a nitrogen atmosphere to form a light diffusion layer with a thickness of 7.0 μm on the PET film to obtained an optical film.

The optical properties of the optical film obtained from Example 4 were determined in accordance with the measurement described hereinbefore. The results were shown in Table 1.

Example 5

The light diffusing coating solution I prepared by Preparation Example 2 was coated on a PET film (O321E) with a thickness of 100 μm having a birefringence (Δn) of 0.052 and an in-plane retardation R0(550 nm) of 5168 nm. After drying, the coated film was cured by a UV lamp with a radiation dose of 298 mJ/cm$^2$ under a nitrogen atmosphere to form a light diffusion layer with a thickness of 5.0 μm on the PET film to obtain an optical film.

The optical properties of the optical film obtained from Example 5 were determined in accordance with the measurement described hereinbefore. The results were shown in Table 1.

Example 6

The light diffusing coating solution II prepared by Preparation Example 3 was coated on a PET film (O321E) with a thickness of 100 μm having a birefringence (Δn) of 0.052 and an in-plane retardation R0(550 nm) of 5168 nm. After drying, the coated film was cured by a UV lamp with a radiation dose of 298 mJ/cm$^2$ under a nitrogen atmosphere to form a light diffusion layer with a thickness of 7.0 μm on the PET film to obtained an optical film.

The optical properties of the optical film obtained from Example 6 were determined in accordance with the measurement described hereinbefore. The results were shown in Table 1.

Comparative Examples 1 and 2

An uncoated PET film (O321E, available from Mitsubishi Chemical Corp, Japan) with a thickness of 50 μm having a birefringence (Δn) of 0.043 and an in-plane retardation R0(550 nm) of 2136 nm, and an uncoated PET film (O321E) with a thickness of 75 μm having a birefringence (Δn) of 0.049 and an in-plane retardation R0(550 nm) of 3654 nm, were provided for measuring the light transmittance, haze, the average reflectivity ($R_{SCI}$) of diffuse component and specular component of SCI and an average reflectivity ($R_{SCE}$) of diffuse component of SCE as described in Example 1. The results were listed in Table 1.

TABLE 1

The measurement results of Examples 1 to 6 and Comparative Examples 1 to 2

| Example | Comparative Example 1 | Comparative Example 2 | Example 1 | Example 2 | Example 3 | Example 4 | Example 5 | Example 6 |
|---|---|---|---|---|---|---|---|---|
| Light transmittance (%) | 91.0 | 90.7 | 90.4 | 91.8 | 90.4 | 91.6 | 90.3 | 91.5 |
| Total haze (%) | 1.3 | 1.3 | 55.1 | 71.3 | 55.9 | 70.5 | 58.6 | 71.0 |
| Internal haze (%) | 1.0 | 0.9 | 3.1 | 34.9 | 2.7 | 33.7 | 3.1 | 33.9 |
| Surface haze (%) | 0.3 | 0.4 | 52.0 | 36.4 | 53.2 | 36.8 | 55.5 | 37.1 |
| Gloss 20° | — | — | 1.0 | 0.6 | 1.0 | 0.8 | 0.9 | 0.8 |
| 60° | — | — | 9.1 | 8.2 | 9.4 | 9.0 | 8.3 | 8.1 |
| 85° | — | — | 18.6 | 26.9 | 18.9 | 32.0 | 16.6 | 10.6 |
| Clarity (total) | — | — | 15.6 | 16.9 | 15.5 | 15.9 | 15.4 | 15.8 |
| $R_{SCI}$, % | 5.03 | 5.05 | 4.23 | 4.23 | 4.27 | 4.26 | 4.34 | 4.33 |
| $R_{SCE}$, % | 0.71 | 0.36 | 3.60 | 3.81 | 3.68 | 3.75 | 3.78 | 3.95 |
| ($R_{SCI}$ − $R_{SCE}$) % | 4.32 | 4.69 | 0.63 | 0.42 | 0.59 | 0.51 | 0.56 | 0.38 |
| $R_{SCE}$/($R_{SCI}$ − $R_{SCE}$) | 0.16 | 0.08 | 5.71 | 9.07 | 6.23 | 7.35 | 6.75 | 10.39 |
| Rainbow Mura | poor | poor | extremely excellent | extremely excellent | extremely excellent | extremely excellent | extremely excellent | extremely excellent |

From results obtained from Examples 1 to 6, the optical films of the present invention can significantly reduce the rainbow interference pattern.

Examples 7 to 12

The refractive-index-matching coating solution I prepared by Preparation Example 5 was respectively coated on the light diffusing layers of the optical films obtained from Examples 1 to 6 to generate films of Examples 7 to 12. Each of the films of Examples 7 to 12 was dried in an oven at 80° C. and cured by a UV lamp with a radiation dose of 350 mJ/cm$^2$ under a nitrogen atmosphere to form a refractive-index-matching layer with a thickness of 0.13 μm on the light diffusion layer to obtain an optical film.

The optical properties and cloudiness evaluation of the optical films obtained from Examples 7 to 12 were determined in accordance with the measurement described in Example 1. The results were shown in Table 2.

Cloudiness evaluation: The cloudiness was evaluated by adhering the optical film via a transparent optical adhesive to a black acrylate plate and evaluated at viewing angles of 0 degree and 60 degrees. If there was no cloudiness, the evaluation was "extremely excellent"; if there was slightly cloudiness, but the quality was acceptable, the evaluation was "excellent"; if there was obvious cloudiness, the evaluation was "poor".

TABLE 2

The measurement results of optical properties of Examples 7 to 12

| Example | Example 7 | Example 8 | Example 9 | Example 10 | Example 11 | Example 12 |
|---|---|---|---|---|---|---|
| Light transmittance (%) | 93.1 | 93.9 | 92.7 | 93.8 | 92.4 | 93.7 |
| Total haze (%) | 52.8 | 68.1 | 53.7 | 68.7 | 55.7 | 65.9 |
| Internal haze (%) | 6.3 | 33.9 | 6.3 | 37.9 | 6.1 | 35.0 |
| Surface haze (%) | 46.5 | 34.2 | 47.4 | 30.8 | 49.6 | 30.9 |
| Gloss 20° | 0.7 | 0.4 | 0.4 | 0.4 | 0.2 | 0.4 |
| 60° | 5.1 | 5.1 | 5.5 | 5.5 | 4.9 | 6.2 |
| 85° | 20.5 | 27.3 | 22.7 | 28.0 | 17.7 | 29.9 |
| Clarity (total) | 14.3 | 15.7 | 14.2 | 15.3 | 15.7 | 15.3 |
| $R_{SCI}$, % | 1.91 | 2.07 | 1.96 | 1.99 | 1.94 | 1.87 |
| $R_{SCE}$, % | 1.60 | 1.87 | 1.59 | 1.74 | 1.43 | 1.61 |
| $((R_{SCI} - R_{SCE}), \%)$ | 0.31 | 0.20 | 0.37 | 0.25 | 0.51 | 0.26 |
| $R_{SCE}/(R_{SCI} - R_{SCE})$ | 5.16 | 9.35 | 4.30 | 6.96 | 2.80 | 6.19 |
| Rainbow Mura | extremely excellent | extremely excellent | extremely excellent | extremely excellent | extremely excellent | extremely excellent |
| Cloudiness | extremely excellent | extremely excellent | extremely excellent | extremely excellent | extremely excellent | extremely excellent |

Example 13

The light diffusing coating solution I prepared by Preparation Example 2 was coated on a PET film (V7610, commercially available from SKC, Co. Ltd. Korea) with a thickness of 50 μm having a birefringence (Δn) of 0.071 and an in-plane retardation R0(550 nm) of 3526 nm. The coated film was dried and cured by a UV lamp with a radiation dose of 298 mJ/cm² under a nitrogen atmosphere to form a light diffusion layer with a thickness of 6.6 μm on the PET film. Then, the refractive-index-matching coating solution I prepared by Preparation Example 5 was coated on the light diffusing layer. The film coated with the refractive-index-matching coating solution was dried in an oven at 80° C. and cured by a UV lamp with a radiation dose of 350 mJ/cm² under a nitrogen atmosphere to form a refractive-index-matching layer with a thickness of 0.13 μm on the light diffusion layer to obtain an optical film.

The optical properties and cloudiness evaluation of the optical film obtained from Example 13 were determined in accordance with the measurement described in Examples 1 and 7. The results were shown in Table 3.

Example 14

The light diffusing coating solution I prepared by Preparation Example 2 was coated on a PET film (V7610 P, commercially available from SKC, Co. Ltd. Korea) with a thickness of 75 μm having a birefringence (Δn) of 0.034 and an in-plane retardation R0(550 nm) of 2514 nm. The coated film was dried and cured by a UV lamp with a radiation dose of 298 mJ/cm² under a nitrogen atmosphere to form a light diffusion layer with a thickness of 6.0 μm on the PET film. Then, the refractive-index-matching coating solution I prepared by Preparation Example 5 was coated on the light diffusing layer. The film coated with the refractive-index-matching coating solution was dried in an oven at 80° C. and cured by a UV lamp with a radiation dose of 350 mJ/cm² under a nitrogen atmosphere to form a refractive-index-matching layer with a thickness of 0.13 μm on the light diffusion layer to obtain an optical film.

The optical properties and cloudiness evaluation of the optical film obtained from Example 14 were determined in accordance with the measurement described in Examples 1 and 7. The results were shown in Table 3.

Example 15

The light diffusing coating solution II prepared by Preparation Example 3 was coated on a PET film (V7610 P) with a thickness of 75 μm having a birefringence (Δn) of 0.034 and an in-plane retardation R0(550 nm) of 2514 nm. The coated film was dried and cured by a UV lamp with a radiation dose of 298 mJ/cm² under a nitrogen atmosphere to form a light diffusion layer with a thickness of 6.4 μm on the PET film. Then, the refractive-index-matching coating solution I prepared by Preparation Example 5 was coated on the light diffusing layer. The film coated with the refractive-index-matching coating solution was dried in an oven at 80° C. and cured by a UV lamp with a radiation dose of 350 mJ/cm² under a nitrogen atmosphere to form a refractive-index-matching layer with a thickness of 0.13 μm on the light diffusion layer to obtain an optical film.

The optical properties and cloudiness evaluation of the optical film obtained from Example 15 were determined in accordance with the measurement described in Examples 1 and 7. The results were shown in Table 3.

Example 16

The light diffusing coating solution I prepared by Preparation Example 2 was coated on a PET film (TU94, commercially available from SKC, Co. Ltd. Korea) with a thickness of 50 μm having a birefringence (Δn) of 0.043 and an in-plane retardation R0(550 nm) of 2139 nm. The coated film was dried and cured by a UV lamp with a radiation dose of 298 mJ/cm² under a nitrogen atmosphere to form a light diffusion layer with a thickness of 5.8 μm on the PET film. Then, the refractive-index-matching coating solution I prepared by Preparation Example 5 was coated on the light diffusing layer. The film coated with the refractive-index-matching coating solution was dried in an oven at 80° C. and cured by a UV lamp with a radiation dose of 350 mJ/cm² under a nitrogen atmosphere to form a refractive-index-matching layer with a thickness of 0.13 μm on the light diffusion layer to obtain an optical film.

The optical properties and cloudiness evaluation of the optical film obtained from Example 16 were determined in accordance with the measurement described in Examples 1 and 7. The results were shown in Table 3.

Example 17

The light diffusing coating solution I prepared by Preparation Example 2 was coated on a PET film (U403, commercially available from Toray, Co. Ltd. Japan) with a thickness of 75 μm having a birefringence (Δn) of 0.046 and an in-plane retardation R0(550 nm) of 3454 nm. The coated film was dried and cured by a UV lamp with a radiation dose of 298 mJ/cm² under a nitrogen atmosphere to form a light diffusion layer with a thickness of 4.5 μm on the PET film. Then, the refractive-index-matching coating solution I prepared by Preparation Example 5 was coated on the light diffusing layer. The film coated with the refractive-index-matching coating solution was dried in an oven at 80° C. and cured by a UV lamp with a radiation dose of 350 mJ/cm² under a nitrogen atmosphere to form a refractive-index-matching layer with a thickness of 0.13 μm on the light diffusion layer to obtain an optical film.

The optical properties and cloudiness evaluation of the optical film obtained from Example 17 were determined in accordance with the measurement described in Examples 1 and 7. The results were shown in Table 3.

Example 18

The light diffusing coating solution III prepared by Preparation Example 4 was coated on a PET film (O321E) same with a thickness of 50 μm as the PET used in Example 1 and 2 with a birefringence (Δn) of 0.043 and an in-plane retardation R0(550 nm) of 2136 nm. The coated film was dried and cured by a UV lamp with a radiation dose of 298 mJ/cm² under a nitrogen atmosphere to form a light diffusion layer with a thickness of 5.2 μm on the PET film. Then, the refractive-index-matching coating solution II prepared by Preparation Example 6 was coated on the light diffusing layer. The film coated with the refractive-index-matching coating solution was dried in an oven at 80° and cured by a UV lamp with a radiation dose of 350 mJ/cm² under a nitrogen atmosphere to form a refractive-index-matching layer with a thickness of 0.13 μm on the light diffusion layer to obtain an optical film.

The optical properties and cloudiness evaluation of the optical film obtained from Example 18 were determined in accordance with the measurement described in Examples 1 and 7. The results were shown in Table 3.

Comparative Example 3

An uncoated PET film (V7610) with a thickness of 50 μm having a birefringence (Δn) of 0.071 and an in-plane retardation R0(550 nm) of 3526 nm was provided for measuring the light transmittance, haze, the average reflectivity ($R_{SCI}$) of diffuse component and specular component of SCI and an average reflectivity ($R_{SCE}$) of diffuse component of SCE as described in Example 1. The results were listed in Table 3.

TABLE 3

The measurement results of Examples 13 to 18 and Comparative Example 3

| Example | Comparative Example 3 | Example 13 | Example 14 | Example 15 | Example 16 | Example 17 | Example 18 |
|---|---|---|---|---|---|---|---|
| Light transmittance (%) | 91.3 | 92.0 | 92.7 | 93.5 | 92.6 | 92.9 | 91.62 |
| Total haze (%) | 2.0 | 50.5 | 53.2 | 61.5 | 46.0 | 51.2 | 35.20 |
| Internal haze (%) | 1.5 | 5.8 | 3.4 | 34.1 | 6.5 | 6.6 | 3.66 |
| Surface haze (%) | 0.5 | 44.7 | 49.8 | 27.4 | 39.5 | 44.6 | 31.54 |
| Gloss     20° | — | 0.5 | 0.4 | 0.6 | 0.3 | 0.2 | 0.8 |
|           60° | — | 6.0 | 5.3 | 8.2 | 6.5 | 5.4 | 3.2 |
|           85° | — | 21.5 | 19.7 | 37.2 | 24.6 | 20.9 | 34.0 |
| Clarity (total) | — | 17.0 | 15.2 | 16.4 | 16.1 | 16.6 | 16.6 |
| $R_{SCI}$, % | 4.79 | 1.90 | 1.86 | 1.87 | 1.64 | 1.72 | 1.87 |
| $R_{SCE}$, % | 0.41 | 1.22 | 1.57 | 1.41 | 1.09 | 1.25 | 1.15 |
| (($R_{SCI} - R_{SCE}$), %) | 4.38 | 0.68 | 0.29 | 0.46 | 0.55 | 0.47 | 0.72 |
| $R_{SCE}/(R_{SCI} - R_{SCE})$ | 0.09 | 1.79 | 5.41 | 3.07 | 1.98 | 2.66 | 1.60 |
| Rainbow Mura | poor | extremely excellent | extremely excellent | extremely excellent | extremely excellent | extremely excellent | extremely excellent |
| Cloudiness | extremely excellent | extremely excellent | extremely excellent | extremely excellent | extremely excellent | extremely excellent | extremely excellent |

From results obtained from Examples 7 to 18, it demonstrates that an optical film of the present invention with a refractive-index-matching layer further coated on the light diffusing layer thereof can not only reduce the rainbow interference pattern, but also reduce the cloudiness resulting from the surface of the light diffusing layer.

Although particular embodiments have been shown and described, it should be understood that the above discussion is not intended to limit the present invention to these embodiments. Persons skilled in the art will understand that various changes and modifications may be made without departing from the scope of the present invention as literally and equivalently covered by the following claims.

What is claimed is:

1. An optical film, comprising:
   a birefringent substrate with a birefringence (Δn) of not more than 0.10 having a slow axis and a fast axis perpendicular to each other; and
   a light diffusing layer disposed on one side of the birefringent substrate;
   wherein a total haze of the optical film ranges between 30% and 80%, and a reflectivity of the optical film satisfies the relationship: ($R_{SCI}-R_{SCE}$)≤1.0%, and $R_{SCE}/(R_{SCI}-R_{SCE})$≥1.6.

2. The optical film as claimed in claim 1, wherein the birefringence (Δn) of the birefringent substrate ranges between 0.02 and 0.09.

3. The optical film as claimed in claim 2, wherein the birefringence (Δn) of the birefringent substrate ranges between 0.02 and 0.08.

4. The optical film as claimed in claim 1, wherein the ($R_{SCI}$-$R_{SCE}$) of the optical film ranges between 0.1% and 0.9%, and the $R_{SCE}$ is less than 4.0%.

5. The optical film as claimed in claim 1, wherein the light diffusion layer has a thickness ranges between 2 μm and 10 μm.

6. The optical film as claimed in claim 1, wherein the total haze of the optical film is the sum of a surface haze and an internal haze of the optical film, and the surface haze of the optical film is more than 25%.

7. The optical film as claimed in claim 1, wherein the light diffusing layer further comprises a refractive-index-matching layer, and the light diffusion layer has a refractive index of n1, and the refractive-index-matching layer has a refractive index of n2, and n2<n1.

8. The optical film as claimed in claim 7, wherein n1 ranges between 1.50 and 1.70, n2 ranges between 1.20 and 1.50.

9. The optical film as claimed in claim 7, wherein the refractive-index-matching layer has a thickness ranges between 0.1 μm and 0.3 μm.

10. The optical film as claimed in claim 1, wherein the birefringent substrate is a uniaxial or biaxial stretched polyester film.

11. The optical film as claimed in claim 1, wherein the birefringent substrate has a thickness ranges between 10 μm and 150 μm.

12. An optical film, comprising:
a birefringent substrate with a birefringence (Δn) of not more than 0.10 having a slow axis and a fast axis perpendicular to each other;
a light diffusing layer having a refractive index of n1 disposed on one side of the birefringent substrate; and
a refractive-index-matching layer having a refractive index of n2 disposed on the other side of the light diffusing layer opposite to the birefringent substrate, and n2<n1;
wherein a total haze of the optical film ranges between 30% and 80%, and a reflectivity thereof satisfies the relationship: ($R_{SCI}$-$R_{SCE}$)≤1.0%, and $R_{SCE}$/($R_{SCI}$-$R_{SCE}$)≥1.6.

13. The optical film as claimed in claim 12, wherein n1 ranges between 1.50 and 1.70, n2 ranges between 1.20 and 1.50.

14. The optical film as claimed in claim 12, wherein ($R_{SCI}$-$R_{SCE}$) ranges between 0.1% and 0.9%, and $R_{SCE}$ is less than 2.0%.

15. The optical film as claimed in claim 12, wherein the light diffusion layer has a thickness ranges between 2 μm and 10 μm.

16. The optical film as claimed in claim 12, wherein the refractive-index-matching layer has a thickness ranges between 0.1 μm and 0.3 μm.

17. A polarizer, comprising:
a polarizing layer with an absorption axis; and
an optical film comprising:
a birefringent substrate with a birefringence (Δn) of not more than 0.10 having a slow axis and a fast axis perpendicular to each other, wherein the birefringent substrate is adjacent to the polarizing layer and the slow axis thereof is parallel to the absorption axis of the polarizing layer; and
a light diffusing layer disposed on the other side of the birefringent substrate opposite to the polarizing layer;
wherein a total haze of the optical film ranges between 30% and 80%, and a reflectivity thereof satisfies the relationship: ($R_{SCI}$-$R_{SCE}$)≤1.0%, and $R_{SCE}$/($R_{SCI}$-$R_{SCE}$)≥1.6.

18. The polarizer as claimed in claim 17, wherein an included angle between the absorption axis of the polarizing layer and the horizontal viewing angle direction of the display ranges from 0° to 45°.

* * * * *